(12) United States Patent
Tetelbaum

(10) Patent No.: US 8,539,424 B2
(45) Date of Patent: Sep. 17, 2013

(54) SYSTEM AND METHOD FOR DESIGNING INTEGRATED CIRCUITS THAT EMPLOY ADAPTIVE VOLTAGE SCALING OPTIMIZATION

(75) Inventor: Alexander Tetelbaum, Hayward, CA (US)

(73) Assignee: LSI Corporation, Milpitas, CA (US)

( * ) Notice: Subject to any disclaimer, the term of this patent is extended or adjusted under 35 U.S.C. 154(b) by 10 days.

(21) Appl. No.: 13/058,176

(22) PCT Filed: Aug. 14, 2008

(86) PCT No.: PCT/US2008/073155
§ 371 (c)(1),
(2), (4) Date: Feb. 8, 2011

(87) PCT Pub. No.: WO2010/019147
PCT Pub. Date: Feb. 18, 2010

(65) Prior Publication Data
US 2011/0138347 A1 Jun. 9, 2011

(51) Int. Cl.
*G06F 9/455* (2006.01)
*G06F 17/50* (2006.01)
(52) U.S. Cl.
USPC .......................................................... 716/134
(58) Field of Classification Search
USPC .......................................................... 716/134
See application file for complete search history.

(56) References Cited

U.S. PATENT DOCUMENTS 6,665,847 B1* 12/2003 Maheshwari ................. 716/113
2003/0066034 A1 4/2003 Gross 2007/0226660 A1 9/2007 Ogawa
2007/0250797 A1 10/2007 Engel
2008/0028345 A1 1/2008 Suri et al.
2010/0037188 A1* 2/2010 Jamann et al. ................ 716/2

FOREIGN PATENT DOCUMENTS

| JP | 2005141434 A | 6/2005 |
| TW | 1273457 | 2/2007 |
| TW | 200935265 A | 8/2009 |
| WO | 2010019147 A1 | 2/2010 |

OTHER PUBLICATIONS

Sudeep Pasricha et al.; "Incorporating PVT Variations in System-Level Power Exploration of On-Chip Communication Architectures" Jan. 4, 2008; pp. 363-370.
Jayakumar N et al.; "An asic design methodology with predictably low leakage, using leakage—immune standard cells" Aug. 25, 2003; pp. 128-133.
Young0-Hwan Park et al.; "System-level power-performance trade-offs in bus matrix communication architecture synthesis" Oct. 1, 2006; pp. 300-305.
Taiwan Office Action dated Feb. 26, 2013, Application No. 098137820, Applicant: LSI Corporation, 7 pages.

* cited by examiner

*Primary Examiner* — Suresh Memula

(57) ABSTRACT

A design process optimization system and method for designing a circuit, which may be an integrated circuit (IC) employing adaptive voltage and scaling optimization (AVSO). In one embodiment, the system includes: (1) a process-voltage-temperature (PVT) libraries database configured to contain PVT libraries of PVT characterizations of devices of cells from which the circuit is to be constructed and (2) a PVT library selector coupled to the PVT libraries database and configured to receive a selection indicating a supplemental objective and respond to the selection by selecting one of the PVT libraries from the PVT libraries database, a timing signoff tool later employing at most two corners from the one of the PVT libraries to perform a timing signoff with respect to the circuit.

15 Claims, 4 Drawing Sheets

SYSTEM AND METHOD FOR DESIGNING INTEGRATED CIRCUITS THAT EMPLOY ADAPTIVE VOLTAGE SCALING OPTIMIZATION

CROSS-REFERENCE TO RELATED APPLICATION

This application is the National Stage of, and therefore claims the benefit of, International Application No. PCT/US2008/073155 filed on Aug. 14, 2008, entitled "SYSTEM AND METHOD FOR DESIGNING INTEGRATED CIRCUITS THAT EMPLOY ADAPTIVE VOLTAGE SCALING OPTIMIZATION," which was published in English under International Publication Number WO 2010019147 on Feb. 18, 2010, and has a priority date of Aug. 14, 2008, based on application PCT/US2008/073155. The above application is commonly assigned with this National Stage application and is incorporated herein by reference in its entirety. PCT/US2008/073155 is related to U.S. Provisional Application Ser. No. 61/126,881, filed by Parker, et al., on May 7, 2008, entitled "A Novel Paradigm for Optimizing Performance, Power, Area and/or Yield in Integrated Circuits," commonly assigned with the invention and incorporated herein by reference.

TECHNICAL FIELD

The invention is directed, in general, to integrated circuit (IC) design and, more specifically, to a system and method for designing ICs that employ adaptive voltage and scaling optimization (AVSO).

BACKGROUND

Circuit designers use electronic design automation (EDA) tools, a category of computer aided design (CAD) tools, to design and lay out electronic circuits, including simulating the operation of the circuit, determining where cells (i.e., logic elements including devices, e.g., transistors) should be placed and where the interconnects that couple the cells together should be routed. EDA tools allow designers to construct a circuit and simulate its performance using a computer and without requiring the costly and lengthy process of fabrication. EDA tools are indispensable for designing modern ICs, particularly very-large-scale integrated circuits (VSLICs). For this reason, EDA tools are in wide use.

One such EDA tool performs timing signoff. Timing signoff is one of the last steps in the IC design process and ensures that signal propagation speed (i.e., delay) in a newly-designed circuit is such that the circuit will operate as intended. Signals that propagate too slowly through the circuit cause setup violations; signals that propagate too quickly through the circuit cause hold violations. Setup or hold violations frustrate the logic of the circuit and prevent it from performing the job it was designed to do.

Timing signoff is performed with highly accurate models of the circuit under multiple sets of assumptions regarding expected variations, called "corners." Process-voltage-temperature (PVT) corners are based on assumptions regarding variations in device operation from one IC to another, supply voltage and operating temperature. Resistance-capacitance (R, C, or RC) corners are based on assumptions regarding variations in one or both of interconnect resistance and capacitance from one IC to another. Conventional timing signoff identifies setup and hold violations in a "slow" PVT corner (in which process variations are assumed to yield relatively slow-switching devices and supply voltage and operating temperature are such that device switching speed are their slowest) and a "worst" RC corner (in which process variations are assumed to yield interconnects having relatively high resistance and capacitance). Conventional timing signoff also identifies hold violations in a "fast" PVT corner (in which process variations are assumed to yield relatively fast-switching devices and supply voltage and operating temperature are such that device switching speeds are their fastest) and a "best" RC corner (in which process variations are assumed to yield interconnects having relatively low resistance and capacitance). Conventional signoff timing also takes on-chip variations (OCV), which are process variations occurring over the area of a given IC, into account using statistical methods.

Conserving resources, including energy, has become a pre-eminent objective in today's world. Manufacturers of ICs are sensitive to the need to improve the energy efficiency of their products. Adaptive voltage and scaling optimization (AVSO) is an important component of that overall strategy. The objective underlying AVSO is that an IC should be powered at the lowest possible voltage without sacrificing performance. ICs employing AVSO ("AVSO ICs") determine signal propagation speed in real time and adjust supply voltage to ensure that signal propagation speed remains such that the IC will operate as intended. AVSO has demonstrated its ability to conserve energy and therefore is expected to be evermore widely used in future ICs.

SUMMARY

To address the above-discussed deficiencies of the prior art, one aspect of the invention provides a design process optimization system and method for designing a circuit. In one embodiment, the system includes: (1) a PVT libraries database configured to contain PVT libraries of PVT characterizations of devices of cells from which the circuit is to be constructed and (2) a PVT library selector coupled to the PVT libraries database and configured to receive a selection indicating a supplemental objective and respond to the selection by selecting one of the PVT libraries from the PVT libraries database, a timing signoff tool later employing at most two corners from the one of the PVT libraries to perform a timing signoff with respect to the circuit.

In another embodiment, the system includes: (1) a PVT libraries database configured to contain PVT libraries of PVT characterizations and a selected one of R, C and RC characterizations of devices of cells from which the AVSO IC is to be constructed and (2) a PVT library selector coupled to the PVT libraries database and configured to receive a selection indicating a supplemental objective and respond to the selection by selecting: (2a) a fast-low-nominal (FLN) PVT library if the supplemental objective is a reduced power consumption, (2b) a typical-typical-nominal (TNN) PVT library if the supplemental objective is a compromise between the reduced power consumption and a reduced turn-around time and (2c) a slow-high-nominal (SHN) PVT library if the supplemental objective is the reduced turn-around time, a timing signoff tool later employing at most two corners from one of the FLN, TNN and SHN libraries to perform a timing signoff with respect to the AVSO IC.

Another aspect of the invention provides a method of designing a circuit. In one embodiment, the method includes: (1) selecting a supplemental objective, (2) selecting a PVT library from a PVT libraries database in response to the selecting of the supplemental objective, (3) synthesizing a logical structure of the circuit, (4) placing constituent cells of the circuit in a layout using an appropriate cell library, (5) routing interconnects among the constituent cells and (6) performing a timing signoff using at most two PVT corners from the PVT library.

The foregoing has outlined certain aspects and embodiments of the invention so that those skilled in the pertinent art may better understand the detailed description of the invention that follows. Additional aspects and embodiments will be described hereinafter that form the subject of the claims of the invention. Those skilled in the pertinent art should appreciate that they can readily use the disclosed aspects and embodiments as a basis for designing or modifying other structures for carrying out the same purposes of the invention. Those skilled in the pertinent art should also realize that such equivalent constructions do not depart from the scope of the invention.

BRIEF DESCRIPTION OF THE DRAWINGS

For a more complete understanding of the invention, reference is now made to the following descriptions taken in conjunction with the accompanying drawings, in which.

DETAILED DESCRIPTION OF CERTAIN ASPECTS AND EMBODIMENTS

It has been discovered that the conventional IC design process fails to take advantage of an AVSO IC's ability to adapt its supply voltage in real-time to effect adjustments in signal propagation speed. A design process that is more amenable to AVSO ICs should allow a circuit designer to decide in advance whether power consumption, rapid development (also known as turn-around) time or a compromise between the two is the design objective. It has also been discovered that the slow and fast PVT and RC corners at which conventional signoff timing is performed results are inappropriate for AVSO ICs. A timing signoff for AVSO ICs should make advantageous use of PVT and RC corners and values for OCV margins that the conventional timing signoff process never considered.

Described herein are various embodiments of a system and a method for designing AVSO ICs. The primary objective in designing any IC is to produce a design that functions as intended at a nominal operating frequency $F_0$. The various embodiments described herein allow a circuit designer to select a supplemental objective, such as reduced (e.g., minimum) power consumption P, reduced (e.g., minimum) turn-around time (TAT) or a compromise between P and TAT. Irrespective of which supplemental objective the IC designer selects, the flexible IC design process can yield a single IC design with a timing signoff in a single PVT corner.

Certain embodiments of the system and method allow circuit synthesis, design and optimization to be performed in only one PVT corner, decreasing TAT and design effort. Certain embodiments of the system and method allow timing signoff to be performed in only one or, at most, two PVT corners, further decreasing TAT and design effort. Certain embodiments of the system and method guarantee a required design performance (called the nominal operating frequency $F_0$) at all corners and for all ICs and minimum power consumption if power consumption is selected as the supplemental objective. Finally, certain embodiments of the system and method allow proper PVT corners to be defined and characterized in advance of timing signoff.

Figure 1:
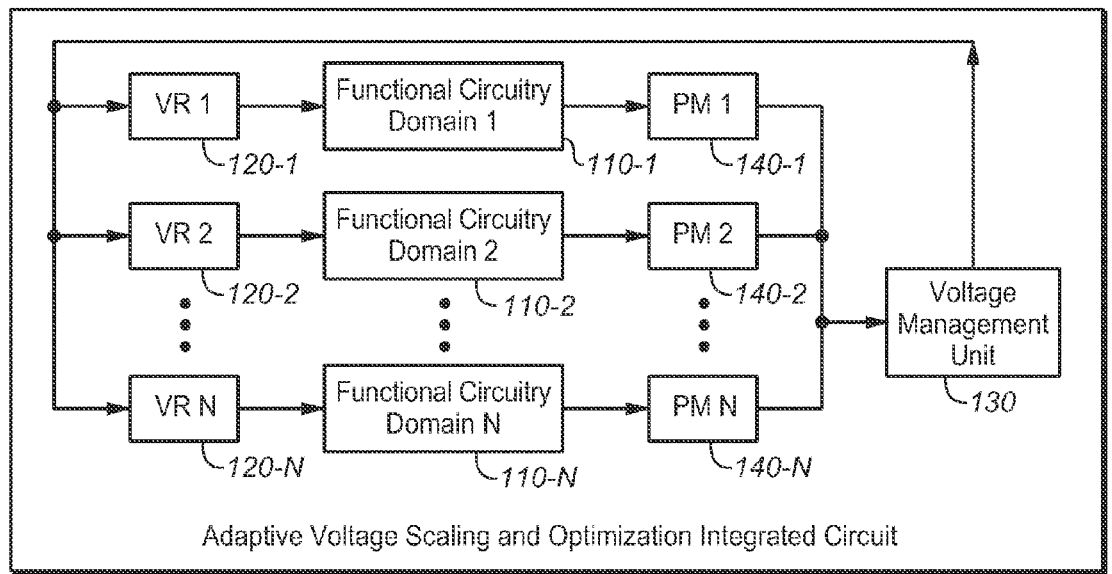
FIG. 1 is a high-level block diagram of one example of an AVSO IC having multiple supply voltage domains that an embodiment of a system or method constructed or carried out according to the principles of the invention may be employed to design.

The general architecture of an AVSO IC will now be described. FIG. 1 is a high-level block diagram of one example of an AVSO IC 100 having N supply voltage domains that an embodiment of a system or method constructed or carried out according to the principles of the invention may be employed to design. Each functional domain includes functional circuitry 110-1, 110-2, ..., 110-N and a corresponding voltage regulator (VR) 120-1, 120-2, ..., 120-N that provides a supply voltage V to each domain that can be adjusted about a nominal voltage $V_0$ within a range $V_{min}$ to $V_{max}$. For purposes of the discussion herein, $V_0$ is assumed to be adjustable within a range of −10% to +15%, viz.: $[V_{min}, V_{max}]=[V_0-10\%, V_0+15\%]$. Further, it will be assumed that this 25% voltage adaptation range is sufficient to compensate for all expected signal propagation speed variations. The latter is a reasonable assumption, because a change in supply voltage yields about twice as much change in delay, viz.: a 25% voltage change results in approximately a 50% delay change.

A voltage management unit (VMU) 130 sets the supply voltage V within the range $V_{min}$ to $V_{max}$ based on signals received from one or more path monitors (PMs) 140-1, 140-2, ..., 140-N associated with paths (typically critical paths) in each domain. The VMU 130 typically sets the supply voltage V in each domain at the lowest level necessary to guarantee that signal propagation speeds are adequate to avoid setup errors. In this manner, the AVSO IC 100 operates at a reduced (e.g., minimal) power consumption level.

Figure 2:
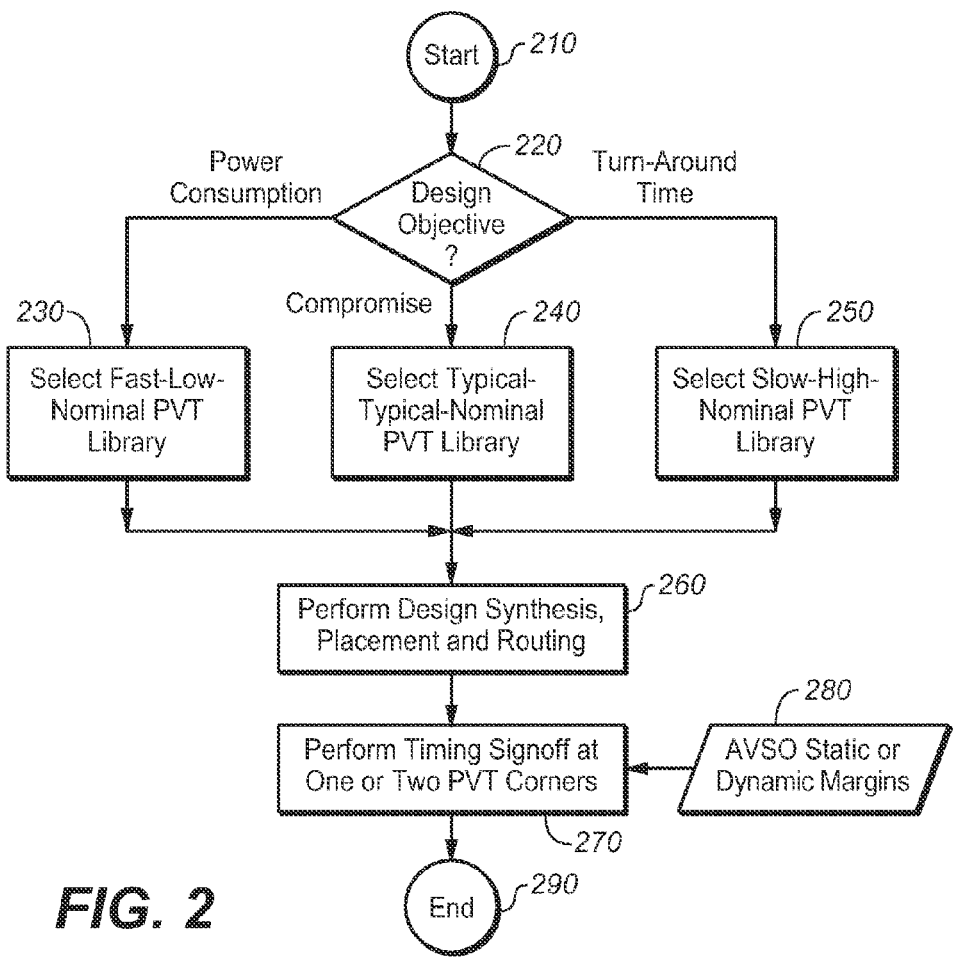
FIG. 2 is a flow diagram of one embodiment of a method of designing AVSO ICs carried out according to the principles of the invention.

FIG. 2 is a flow diagram of one embodiment of a method of designing AVSO ICs carried out according to the principles of the invention. The method begins in a start step 210, in which it is desired to design an AVSO IC. In a decisional step 220, the circuit designer selects a supplemental objective: either a reduced (perhaps minimized) power consumption P, a reduced (perhaps minimized) turn-around time TAT or a compromise between a reduced P and a reduced TAT. If the circuit designer selects reduced P as the supplemental objective, an FLN library of PVT characterizations of the devices from which the cells of the circuit is to be constructed is selected from a database of multiple libraries in a step 230. If the circuit designer selects the compromise between reduced P and reduced TAT as the supplemental objective, a TTN library of PVT characterizations of the devices from which the cells of the circuit is to be constructed is selected from the database of multiple libraries in a step 240. If the circuit designer selects reduced TAT as the supplemental objective, an SHN library of PVT characterizations of the devices from which the cells of the circuit is to be constructed is selected from the database of multiple libraries in a step 250.

Then, in a step 260, the circuit designer enters a process of synthesizing the design in terms of its logical structure, after which constituent cells are chosen using an appropriate cell library, and interconnects are routed among the cells. Next, in a step 270, timing signoff is performed typically at one, or two at most, PVT corners. The timing signoff is performed using the PVT library selected in the steps 230, 240 or 250 and AVSO static or dynamic margins 280 as will be described in conjunction with FIG. 5. The method ends in an end step 290, when timing is "closed" and an AVSO IC has been designed and signed off.

Figure 3A:
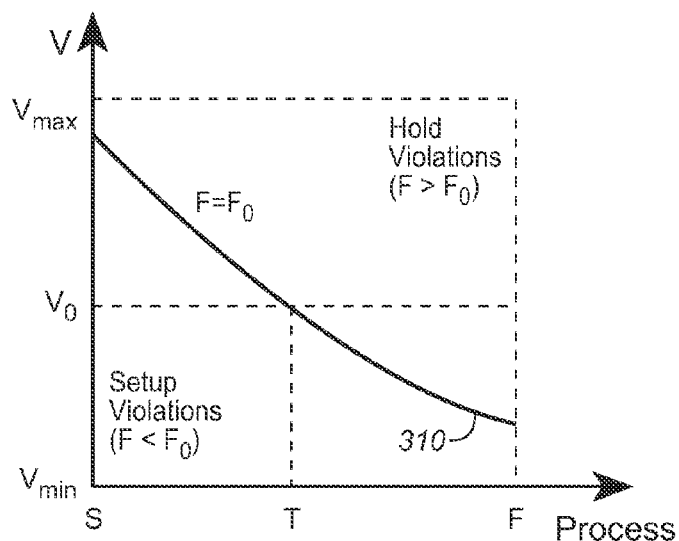
FIGS. 3A and 3B are graphs illustrating how the supply voltage in an AVSO IC adapts to the speed of the devices used in the IC.
Figure 3B:
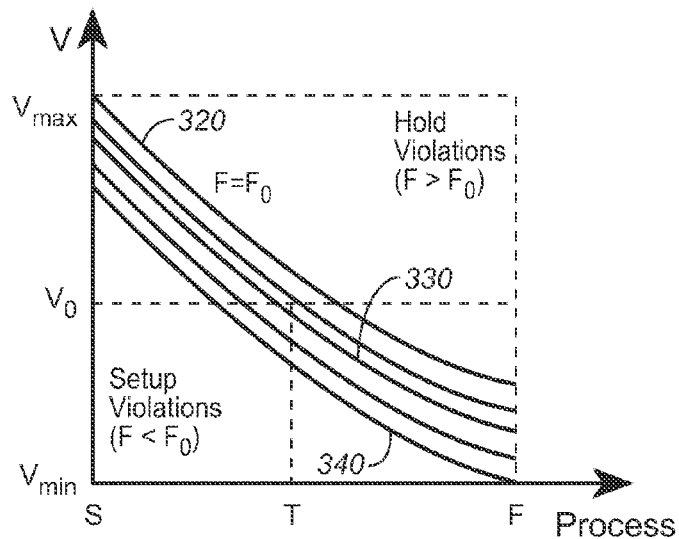

Having described one embodiment of the method of designing AVSO ICs in general, the manner in which an AVSO IC manages supply voltage will now be described in order to understand certain embodiments of the method more specifically. FIGS. 3A and 3B are graphs illustrating how the supply voltage in an AVSO IC adapts to the speed of the devices used in the IC.

FIG. 3A plots required supply voltage V as a function of device speed for an AVSO IC, S being slow, T being typical and F being fast. A curve 310 represents the device speed and supply voltage V intersections at which the actual operating frequency F of the IC equals the nominal operating frequency $F_0$, as is appropriate. If the actual operating frequency F is less than the nominal operating frequency $F_0$, the voltage is inadequate given the device speed, and setup violations result. If the actual operating frequency F is greater than the nominal operating frequency $F_0$, the voltage is excessive given the device speed, and hold violations result. The curve is less than $V_{max}$ at the device speed S and greater than $V_{min}$ at the device speed F, signifying that AVSO can accommodate this range of device speeds without suffering setup or hold violations.

FIG. 3B again plots required supply voltage V as a function of device speed for an AVSO IC. However, FIG. 3B demonstrates that an AVSO IC may achieve any one of multiple curves at which the actual operating frequency F can equal the nominal operating frequency $F_0$, depending upon how much emphasis is placed on power consumption as the AVSO IC is being designed and analyzed with respect to its timing. An upper curve 320 results from relatively little emphasis on power consumption and concomitantly little effort to close timing; a central curve 330 results from more emphasis on power consumption and less effort to close timing; a lower curve 340 results from a significant emphasis on power consumption and accordingly substantial effort to close timing. The curves 320, 330, 340 encompass the same range (the device speeds S to F) of device speed, but the upper curve 320 intersects $V_{max}$ at the device speed S, signifying that the supply voltage must be held at its maximum possible value when device speeds are at their lowest. On the other hand, the lower curve 340 intersects $V_{min}$ at the device speed F, signifying that the supply voltage must be held at its minimum possible value when device speeds are at their highest. Other, unreferenced curves lie between the upper and lower curves 320, 340 and about the central curve 330 and result from various intermediate levels of emphasis on power consumption. From FIG. 3B, it is apparent that a choice exists with respect to the design of AVSO ICs, that of the degree to which power consumption P is emphasized. While reducing P is often desirable, it must be recognized, however, that more time is usually required to complete timing signoff, and TAT increases as a result.

Figure 3C:
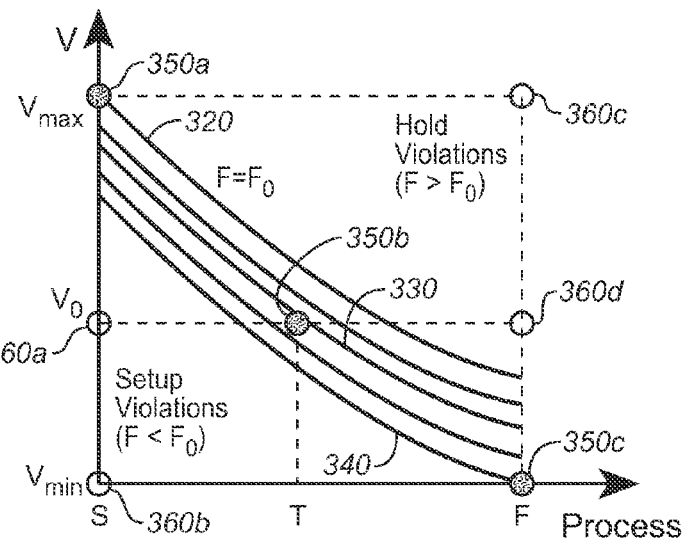
FIG. 3C is a graph illustrating conventional PVT corners and timing checks employed to design an IC.

FIG. 3C is a graph illustrating conventional PVT corners and timing checks employed to design an IC. FIG. 3C again plots required supply voltage V as a function of device speed for an AVSO IC. FIG. 3C shows a plurality of corners 350a, 350b, 350c at which an AVSO IC may be analyzed. These corners 350a, 350b, 350c are known, characterized and included in conventional PVT libraries. Other corners 360a, 360b, 360c, 360d are likewise known, characterized and included in conventional PVT libraries. However, while the corners 360a, 360b will always result in setup violations, and the corners 360c, 360d will always result in hold violations, they are not useful for performing timing signoff for an AVSO IC, because it will never operate under the conditions the corners 360a, 360b, 360c, 360d represent.

Figure 4A:
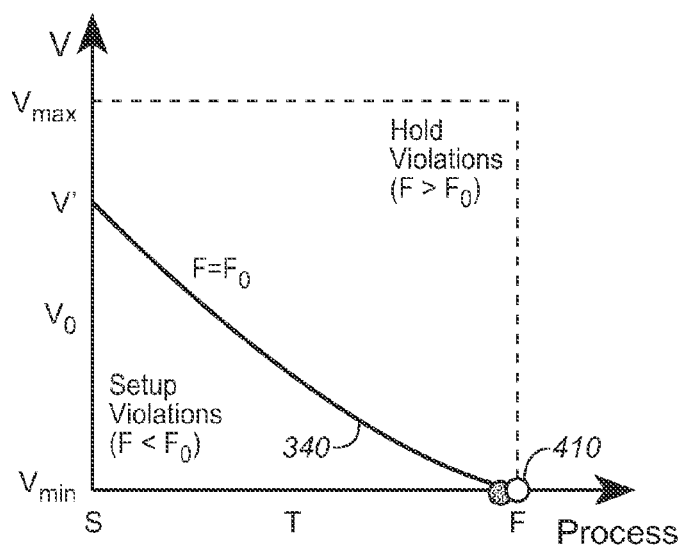
FIGS. 4A-C are graphs illustrating PVT corners and timing checks employed to design an IC according to the principles of the invention.
Figure 4B:
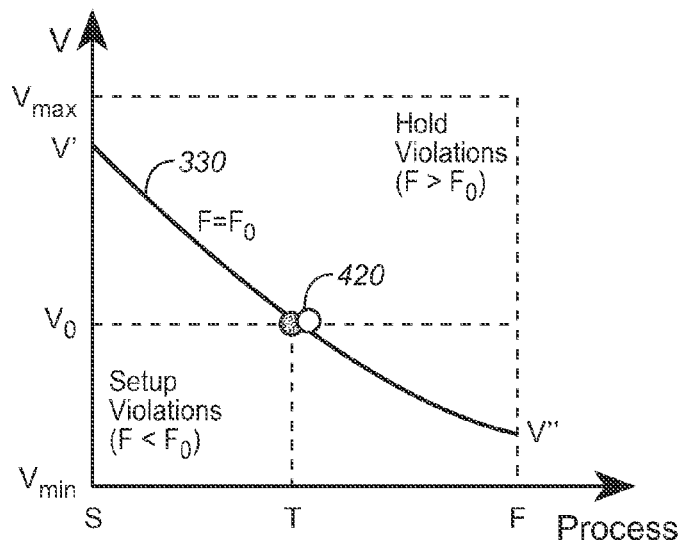
Figure 4C:
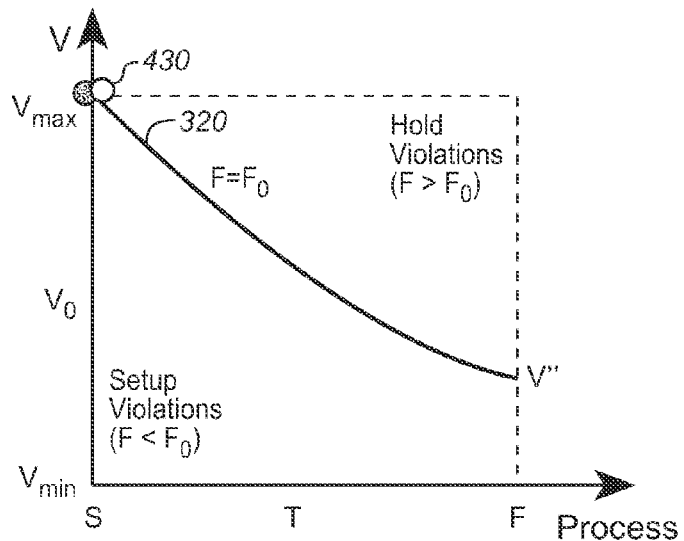

FIGS. 4A-C are graphs illustrating PVT corners and timing checks employed to design an IC according to the principles of the invention. FIG. 4A shows the lower curve 340 of FIGS. 3B and 3C. The lower curve 340 intersects an unknown, intermediate supply voltage V' at the device speed S and a known supply voltage $V_{min}$ at the device speed F. The unknown, intermediate supply voltage V' is specific to each IC and therefore an inappropriate set of assumptions on which to base a PVT library. Two overlapping points 410 (shown as slightly offset from one another purely for purposes of illustration) represent the FLN PVT corner at which the lower curve 340 may be analyzed for timing. If the IC closes timing at the FLN PVT corner, the IC is guaranteed to close timing at all other points along the lower curve 340, since all the other points lie within the supply voltage range $V_{min}$ to $V_{max}$ that AVSO is capable of accommodating.

From FIG. 4A, it is apparent that the timing signoff with respect to the lower curve 340 (the minimum power consumption, maximum closing effort curve) may be achieved by closing timing at the FLN PVT corner 410. Although FIG. 4A does not address R or C corners, a C corner generated from an RC(T) model calibrated at the same temperature as the FLN PVT corner will provide suitable timing signoff. In one embodiment, timing is closed for setup and hold violations with respective high and low temperature reports at the FLN/Cbest corner. Cbest is the corner at which the RC model produces lowest interconnect capacitance, resulting in the fastest signal propagation speed. Margins, as described below, should be used in the timing signoff.

FIG. 4B shows the central curve 330 of FIGS. 3B and 3C. While the central curve 330 intersects an unknown, intermediate supply voltage V' at the device speed S and an unknown supply voltage V" at the device speed F, the central curve 330 intersects a known supply voltage $V_0$ at the device speed T. Like the intermediate supply voltage V', the intermediate supply voltage V" is specific to each IC and therefore an inappropriate set of assumptions on which to base a PVT library. Two overlapping points 420 represent the TTN PVT corner at which the central curve 330 may be analyzed for timing. If the IC closes timing at the TTN PVT corner, the IC is guaranteed to close timing at all other points along the central curve 330, since all the other points lie within the supply voltage range $V_{min}$ to $V_{max}$ that AVSO is capable of accommodating.

From FIG. 4B, it is apparent that the timing signoff with respect to the central curve 330 (the curve representing a compromise between power consumption P and closing effort, or turn-around time TAT) may be achieved by closing timing at the TNN PVT corner 420. Again, a C corner generated from an RC(T) model calibrated at the same temperature as the TNN PVT corner will provide suitable timing signoff. In one embodiment, timing is closed for setup and hold violations with maximum and minimum reports at the TNN/Cnom corner. Cnom is the corner at which the RC model produces a nominal interconnect capacitance, resulting in an average signal propagation speed. Margins should be used.

FIG. 4C shows the upper curve 320 of FIGS. 3B and 3C. The upper curve 320 intersects a known supply voltage $V_{max}$ at the device speed S and an unknown, intermediate supply voltage V" at the device speed F. Two overlapping points 430 represent the SHN PVT corner at which the upper curve 320 may be analyzed for timing. If the IC closes timing at the SHN PVT corner, the IC is guaranteed to close timing at all other points along the upper curve 320, since all the other points lie within the supply voltage range $V_{min}$ to $V_{max}$ that AVSO is capable of accommodating.

From FIG. 4C, it is apparent that the timing signoff with respect to the upper curve 320 (the maximum power consumption, minimum closing effort curve) may be achieved by closing timing at the SHN PVT corner 430. Again, a C corner generated from an RC(T) model calibrated at the same temperature as the SHN PVT corner will provide suitable timing signoff. In one embodiment, timing is closed for setup and hold violations with respective high and low temperature reports at the FLN/Cworst corner. Cworst is the corner at which the RC model produces the highest interconnect capacitance, resulting in the slowest signal propagation speed. Margins should be used.

Reducing the number of corners at which timing signoff must be achieved reduces TAT, perhaps significantly, without compromising the nominal operating frequency $F_0$ or reliability of the resulting IC. Table 1, below, compares the timing signoff methods that are described above in terms of actual operating frequency F, power consumption P, turn-around time TAT and supply voltage V.

TABLE 1

Comparison of Timing Signoff Methods

| Signoff Method | Actual Operating Frequency F | Power Consumption P | Turn-around Time TAT | Supply Voltage V |
|---|---|---|---|---|
| FLH | Guaranteed to equal the nominal operating frequency $F_0$ for any IC | Minimum for any IC | Maximum | Minimum feasible supply voltage |
| FLL | | | | |
| SHH | | Maximum for any IC | Minimum | Maximum feasible supply voltage |
| SHL | | | | |
| TNN | | Average | Low (one signoff corner) | Maximum feasible supply voltage range |

As stated above, AVSO dynamically adapts the supply voltage V to maintain the actual operating frequency at the nominal operating frequency, $F=F_0$. AVSO is able to compensate for most OCV variations. Thus, timing signoff does not require margins for AVSO-compensated variations. However, AVSO is not able to compensate for all variations; its adaptation may not be precise or instantaneous. For example, AVSO may be subject to signal propagation speed calculation error, and supply voltage adaptation may be delayed, resulting in dynamic voltage drop (DVD). Therefore, timing signoff should include margins for variations that AVSO may cause or not always correct. It is inappropriate to modify the SHN, TNN or FLN PVT corners to add these variations statistically, because they are realistic corners, and not low-probability, traditional corners. Therefore, some embodiments of the system and method described herein introduce a new, AVSO margin, $M_{AVSO}$, to timing signoff to avoid timing violations.

Figure 5:
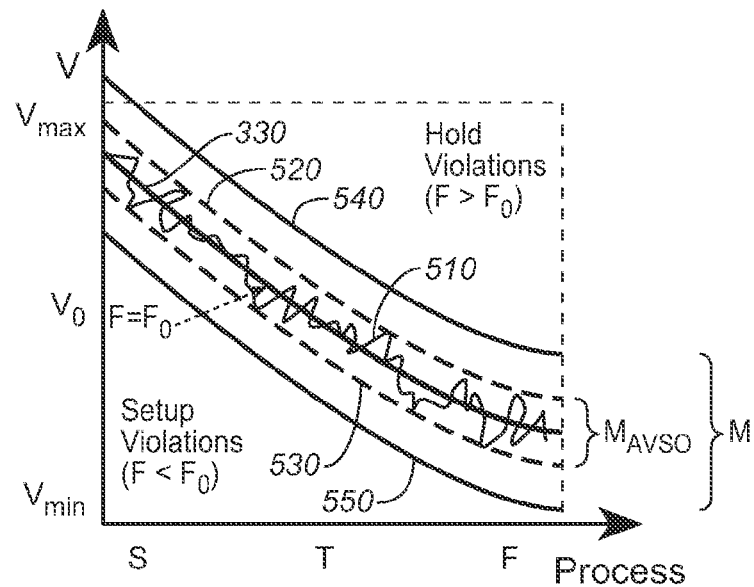
FIG. 5 is a graph illustrating additional and total margins desired for the proper operation of an AVSO IC.

FIG. 5 is a graph illustrating additional and total margins desired for the proper operation of an AVSO IC. The central curve 330 of FIGS. 3B and 3C will be used for purposes of illustration. A line 510 represents variations that AVSO may cause or not always correct. The line 510 falls between upper and lower bounds 520, 530. Upper and lower bounds 540, 550 represent a total margin M needed to accommodate all variations for which timing signoff should account.

For purposes of determining $M_{AVSO}$, clock signals provided to the IC will be assumed to be balanced and symmetrical (zero skew). Clock uncertainty CU is set equal to 50 ps to compensate for small delays in data paths. Launch clock, data path and capture clock setup and hold margins in all paths are assumed to be 4% each. The total margin M, which is an equivalent of static timing analysis (STA) de-rating factor, is a statistical sum (using reduced sufficient statistics) of several margins: the AVSO margin $M_{AVSO}$ set at about 5% of typical, a path delay error margin $M_{DELAY}$ set at about 10% of typical and a DVD margin $M_{DVD}$ set at about 5% of typical. The following equation results:

$$M = \sqrt{M_{Delay}^2 + M_{AVSO}^2 + M_{DVD}^2} \approx 12\%.$$

Figure 6:
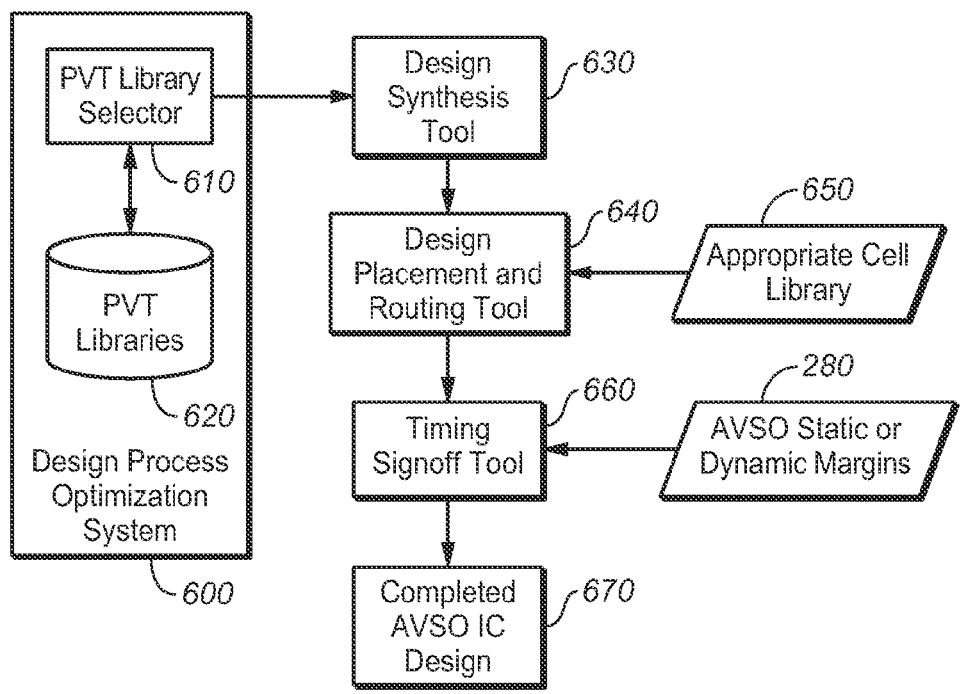
FIG. 6 is a block diagram of one embodiment of a system for designing AVSO ICs constructed according to the principles of the invention.

FIG. 6 is a block diagram of one embodiment of a system for designing AVSO ICs, namely a design process optimization system 600, constructed according to the principles of the invention. The system 600 includes a PVT library selector 610. The PVT library selector 610 is configured to receive a selection from a circuit designer indicating a supplemental objective. In the illustrated embodiment, the supplemental objective may be a reduced (perhaps minimized) power consumption P, a reduced (perhaps minimized) turn-around time TAT or one or more compromises between a reduced P and a reduced TAT.

A PVT libraries database 620 is coupled to the PVT library selector 610. The PVT libraries database 620 is configured to store various PVT libraries of PVT characterizations of the devices from which the cells of the circuit is to be constructed. In one embodiment, the libraries include R, C or RC characterizations as well. In response to the circuit designer's selection, the PVT library selector 610 selects an FLN library if the circuit designer selects reduced P as the supplemental objective, a TTN library if the circuit designer selects a compromise between reduced P and reduced TAT as the supplemental objective and an SHN library if the circuit designer selects reduced TAT as the supplemental objective.

The circuit designer then uses a conventional or later-developed design synthesis tool 630 to synthesize the design in terms of its logical structure, after which the circuit designer uses a conventional or later-developed design placement and routing tool 640 to select cells from an appropriate cell library 650, place the cells appropriately and route interconnects among the cells as needed. Then, the circuit designer invokes a conventional or later-developed timing signoff tool 660, which performs a timing signoff with respect to the circuit using only one, or at most two PVT corners from the PVT library that the PVT library selector 610 selected and with reference to AVSO static or dynamic margins 280. Timing is then closed, and an AVSO IC design 670 results.

Certain embodiments of the invention further relate to computer storage products with a computer-readable medium that have program code thereon for performing various computer-implemented operations that embody the tools or carry out the steps of the methods set forth herein. The media and program code may be those specially designed and constructed for the purposes of the invention, or they may be of the kind well known and available to those having skill in the computer software arts. Examples of computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which the invention relates will appreciate that other and further additions, deletions, substitutions and modifications may be made to the described embodiments without departing from the scope of the invention.

What is claimed is:

1. A design process system for designing a circuit, comprising:
   a process-voltage-temperature (PVT) libraries database configured to contain PVT libraries of PVT characterizations of devices of cells from which said circuit is to be constructed; and
   a PVT library selector coupled to said PVT libraries database and configured to receive a selection indicating a supplemental objective for said designing said circuit and respond to said selection by selecting one of said PVT libraries from said PVT libraries database, a timing signoff tool later employing at most two corners from said one of said PVT libraries to perform a timing signoff with respect to said circuit, wherein said at most two PVT corners are realistic corners.

2. The system as recited in claim 1 wherein said PVT library selector selects:
   a fast-low-nominal PVT library if said supplemental objective is a reduced power consumption,
   a typical-typical-nominal PVT library if said supplemental objective is a compromise between said reduced power consumption and a reduced turn-around time, and
   a slow-high-nominal PVT library if said supplemental objective is said reduced turn-around time.

3. The system as recited in claim 2 wherein said reduced power consumption is a minimum power consumption.

4. The system as recited in claim 1 wherein said PVT libraries include a selected one of R, C and RC characterizations of said devices.

5. The system as recited in claim 1 wherein:
   timing is closed for setup and hold violations with respective high and low temperature reports at a fast-low-nominal/Cbest corner if said supplemental objective is a reduced power consumption;
   timing is closed for setup and hold violations with maximum and minimum reports at a typical-typical-nominal/Cnom corner if said supplemental objective is a compromise between said reduced power consumption and a reduced turn-around time; and
   timing is closed for setup and hold violations with respective high and low temperature reports at a slow-high-nominal/Cworst corner if said supplemental objective is said reduced turn-around time.

6. The system as recited in claim 1 wherein said timing signoff tool also employs static or dynamic adaptive voltage and scaling optimization margins to perform said timing signoff.

7. The system as recited in claim 1 wherein said circuit is an integrated circuit employing adaptive voltage and scaling optimization.

8. The design process system as recited in claim 1 wherein a primary objective for designing said circuit is to operate at a nominal operating frequency and said supplemental objective differs from said primary objective.

9. A method of designing a circuit, comprising:
   receiving a selection for a supplemental objective for said designing of said circuit;
   selecting a process-voltage-temperature (PVT) library from a PVT libraries database in response to said selection of said supplemental objective;
   synthesizing a logical structure of said circuit;
   placing constituent cells of said circuit in a layout using an appropriate cell library;
   routing interconnects among said constituent cells; and
   performing a timing signoff using at most two PVT corners from said PVT library, wherein said at most two PVT corners are realistic corners.

10. The method as recited in claim 9 wherein said selecting said PVT library comprises:
    selecting a fast-low-nominal PVT library if said supplemental objective is a reduced power consumption,
    selecting a typical-typical-nominal PVT library if said supplemental objective is a compromise between reduced power consumption and reduced turn-around time, and
    selecting a slow-high-nominal PVT library if said supplemental objective is said reduced turn-around time.

11. The method as recited in claim 10 wherein said reduced power consumption is a minimum power consumption.

12. The method as recited in claim 9 wherein said PVT libraries include a selected one of R, C and RC characterizations of said devices.

13. The method as recited in claim 9 further comprising:
    employing respective high and low temperature reports at a fast-low-nominal/Cbest corner to close timing for setup and hold violations in said circuit if said supplemental objective is a reduced power consumption;
    employing respective maximum and minimum reports at a typical-typical-nominal/Cnom corner to close timing for setup and hold violations in said circuit if said supplemental objective is a compromise between said reduced power consumption and a reduced turn-around time; and
    employing respective high and low temperature reports at a slow-high-nominal/Cworst corner to close timing for setup and hold violations in said circuit if said supplemental objective is said reduced turn-around time.

14. The method as recited in claim 9 further comprising employing static or dynamic adaptive voltage and scaling optimization margins to perform said timing signoff.

15. The method as recited in claim 9 wherein said circuit is an integrated circuit employing adaptive voltage and scaling optimization.

* * * * *